United States Patent
Kageyama et al.

(10) Patent No.: US 11,049,651 B2
(45) Date of Patent: Jun. 29, 2021

(54) ELECTRONIC COMPONENT AND METHOD FOR MANUFACTURING SAME

(71) Applicant: Murata Manufacturing Co., Ltd., Nagaokakyo (JP)

(72) Inventors: Tomohiro Kageyama, Nagaokakyo (JP); Tetsuo Kawakami, Nagaokakyo (JP); Manabu Sakai, Nagaokakyo (JP); Ryuki Kakuta, Nagaokakyo (JP); Takahiro Hirao, Nagaokakyo (JP); Takashi Ohara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 427 days.

(21) Appl. No.: 15/810,275

(22) Filed: Nov. 13, 2017

(65) Prior Publication Data

US 2018/0137976 A1    May 17, 2018

(30) Foreign Application Priority Data

Nov. 14, 2016  (JP) ............................. JP2016-221373

(51) Int. Cl.
  *H01G 4/12* (2006.01)
  *H01L 49/02* (2006.01)
  *H01G 4/232* (2006.01)
  *H01G 4/30* (2006.01)
  *H01G 4/012* (2006.01)

(52) U.S. Cl.
  CPC .............. *H01G 4/12* (2013.01); *H01G 4/012* (2013.01); *H01G 4/232* (2013.01); *H01G 4/2325* (2013.01); *H01G 4/30* (2013.01); *H01L 28/40* (2013.01)

(58) Field of Classification Search
  CPC ........... H01G 4/12; H01G 4/232; H01L 28/40
  USPC ...................................... 361/306.3
  See application file for complete search history.

(56) References Cited

U.S. PATENT DOCUMENTS 5,712,758 A *  1/1998  Amano ............... H01G 4/2325
                                                         361/306.3
6,344,963 B1   2/2002  Mori
(Continued)

FOREIGN PATENT DOCUMENTS

JP      04-260314 A     9/1992
JP      2000-277371 A  10/2000
(Continued)

OTHER PUBLICATIONS

Kageyama et al., "Electronic component and manufacturing method for the same," U.S. Appl. No. 15/451,768, filed Mar. 7, 2017.
(Continued)

*Primary Examiner* — Michael P McFadden
(74) *Attorney, Agent, or Firm* — Keating & Bennett, LLP

(57) ABSTRACT

An electronic component includes a first external electrode disposed on a first end surface and a second external electrode disposed on a second end surface. The first external electrode includes a first conductive layer including ceramic particles. The second external electrode includes a second conductive layer including ceramic particles. An end portion of a first internal electrode is located inside the first conductive layer. The electronic component includes little or no cracks and has a low equivalent series resistance (ESR).

15 Claims, 6 Drawing Sheets

(56) References Cited

U.S. PATENT DOCUMENTS

| | | | |
|---|---|---|---|
| 2013/0294006 A1* | 11/2013 | Kang | H01G 4/224 361/301.4 |
| 2014/0240895 A1 | 8/2014 | Lee et al. | |
| 2015/0068792 A1* | 3/2015 | Cho | H01G 2/06 174/258 |
| 2015/0332853 A1 | 11/2015 | Kageyama et al. | |

FOREIGN PATENT DOCUMENTS

| JP | 2009-246167 A | 10/2009 |
|---|---|---|
| JP | 2014-165489 A | 9/2014 |
| JP | 2015-216319 A | 12/2015 |

OTHER PUBLICATIONS

Official Communication issued in Japanese Patent Application No. 2016-221373, dated Jul. 21, 2020.

* cited by examiner

ELECTRONIC COMPONENT AND METHOD FOR MANUFACTURING SAME

CROSS REFERENCE TO RELATED APPLICATIONS

This application claims the benefit of priority to Japanese Patent Application No. 2016-221373 filed on Nov. 14, 2016. The entire contents of this application are hereby incorporated herein by reference.

BACKGROUND OF THE INVENTION

1. Field of the Invention

The present invention relates to an electronic component and a method for manufacturing the electronic component.

2. Description of the Related Art

Conventionally, a large number of electronic components such as a multilayer ceramic capacitor have been used for various electronic devices. For example, Japanese Patent Application Laid-Open No. 2000-277371 describes, as an example of the electronic component, a laminated ceramic electronic component having an external electrode disposed on only an end surface of a rectangular parallelepiped capacitor main body and including a conductive layer to which an internal electrode is connected.

However, in the laminated ceramic electronic component described in Japanese Patent Application Laid-Open No. 2000-277371, a problem that although cracks of a laminate can be suppressed, equivalent series resistance (ESR) is high since the external electrode contains a common material which is a ceramic material, may arise.

SUMMARY OF THE INVENTION

Preferred embodiments of the present invention provide electronic components that significantly reduce or prevent cracks and have low ESR.

An electronic component according to a preferred embodiment of the present invention includes an electronic component main body, a first internal electrode, a second internal electrode, a first auxiliary electrode, a second auxiliary electrode, a first external electrode, and a second external electrode. The electronic component main body includes a first principal surface and a second principal surface, a first side surface and a second side surface, and a first end surface and a second end surface. The first principal surface and the second principal surface extend along a length direction and a width direction. The first side surface and the second side surface extend along the length direction and a laminating direction. The first end surface and the second end surface extend along the width direction and the laminating direction. The electronic component main body contains ceramic particles. The first internal electrode is disposed within the electronic component main body. The second internal electrode is disposed within the electronic component main body. The second internal electrode is opposed to the first internal electrode in the laminating direction with a ceramic layer interposed therebetween. A first auxiliary electrode is opposed to the first internal electrode in the length direction. The first auxiliary electrode is disposed at a distance from the first internal electrode. A second auxiliary electrode is opposed to the second internal electrode in the length direction. The second auxiliary electrode is disposed at a distance from the second internal electrode. A first external electrode is disposed on the first end surface. A second external electrode is disposed on the second end surface. The first external electrode includes a first conductive layer including ceramic particles. The second external electrode includes a second conductive layer including ceramic particles. An end portion of the first internal electrode is located inside the first conductive layer.

In an electronic component according to a preferred embodiment of the present invention, since the end portion of the first internal electrode is located inside the first conductive layer, a length of the first conductive layer between a surface of the first external electrode and the first internal electrode, and has relatively high electric resistance, is short. Thus, resistance between the first internal electrode and the surface of the first external electrode is low. Therefore, resistance between the first external electrode and the second external electrode is low. Accordingly, the electronic component according to this preferred embodiment of the present invention has low ESR.

For example, from the viewpoint of further lowering the ESR to further enhance connection reliability between the first internal electrode and the first external electrode, it is also conceivable that the first internal electrode is disposed so as to penetrate through the first conductive layer. In doing so, the proportion of the first internal electrode in the first conductive layer becomes high. As a result of this, a difference in thermal shrinkage during firing between the first conductive layer and the electronic component main body is increased. Thus, cracks are easily produced during firing.

In contrast, in an electronic component according to a preferred embodiment of the present invention, the first internal electrode does not penetrate through the first conductive layer and is disposed so that the end portion of the first internal electrode is located inside the first conductive layer. As a result of this, the proportion of the first internal electrode in the first conductive layer is reduced. Thus, a difference in thermal shrinkage during firing between the first conductive layer and the electronic component main body is reduced. Accordingly, in an electronic component according to a preferred embodiment of the present invention, cracks are only barely produced during firing. As described above, in an electronic component according to a preferred embodiment of the present invention, the end portion of the first internal electrode is located inside the first conductive layer. Therefore, an electronic component according to a preferred embodiment of the present invention significantly reduces or prevents cracks and has low ESR.

In an electronic component according to a preferred embodiment of the present invention, an end portion of the second auxiliary electrode preferably is located inside the first conductive layer. In this case, since not only the end portion of the first internal electrode but also the end portion of the second auxiliary electrode are located inside the first conductive layer, joint strength between the electronic component main body and the external electrode is enhanced, and consequently connection reliability between the first internal electrode and the first external electrode is enhanced.

In an electronic component according to a preferred embodiment of the present invention, the end portion of the second internal electrode is preferably located inside the second conductive layer. In this case, a length of the second conductive layer between the surface of the second external electrode and the second internal electrode and has relatively high electric resistance, is short. Thus, electric resistance between the second internal electrode and the surface of the second external electrode is low. Therefore, electric resistance between the first external electrode and the second external electrode is lower. Accordingly, lower ESR is realized.

Also, the second internal electrode does not penetrate through the second conductive layer and is disposed so that the end portion of the second internal electrode is located inside the second conductive layer. As a result of this, the proportion of the second internal electrode in the second conductive layer is reduced. Thus, a difference in thermal shrinkage during firing between the second conductive layer and the electronic component main body is reduced. Accordingly, cracks are significantly reduced or prevented during firing.

In an electronic component according to a preferred embodiment of the present invention, an end portion of the first auxiliary electrode is preferably located inside the second conductive layer. In this case, since not only the end portion of the second internal electrode but also the end portion of the first auxiliary electrode are located inside the second conductive layer, joint strength between the electronic component main body and the external electrode is enhanced, and consequently connection reliability between the second internal electrode and the second external electrode is enhanced.

In an electronic component according to a preferred embodiment of the present invention, the end portion of the second internal electrode and the end portion of the first auxiliary electrode are preferably each positioned inside the second conductive layer.

In an electronic component according to a preferred embodiment of the present invention, the first external electrode may further include a third conductive layer disposed on the first conductive layer. In this case, the content of the ceramic particle in the first conductive layer is higher than the content of the ceramic particle in the third conductive layer.

In an electronic component according to a preferred embodiment of the present invention, the second external electrode may further include a fourth conductive layer disposed on the second conductive layer. In this case, the content of the ceramic particle in the second conductive layer is higher than the content of the ceramic particle in the fourth conductive layer.

In an electronic component according to a preferred embodiment of the present invention, the third conductive layer is preferably isolated from (that is, spaced away from) the electronic component main body by the first conductive layer.

In an electronic component according to a preferred embodiment of the present invention, the fourth conductive layer is preferably isolated from (that is, spaced away from) the electronic component main body by the second conductive layer In an electronic component according to a preferred embodiment of the present invention, a portion of the first internal electrode which is located inside the first conductive layer preferably has a curved shape in viewing a cross-section along the length direction and the laminating direction from the width direction.

In an electronic component according to a preferred embodiment of the present invention, a portion of the first auxiliary electrode which is located inside the second conductive layer preferably has a curved shape in viewing a cross-section along the length direction and the laminating direction from the width direction.

In an electronic component according to a preferred embodiment of the present invention, a portion of the second internal electrode which is located inside the second conductive layer preferably has a curved shape in viewing a cross-section along the length direction and the laminating direction from the width direction.

In an electronic component according to a preferred embodiment of the present invention, a portion of the second auxiliary electrode which is located inside the first conductive layer preferably has a curved shape in viewing a cross-section along the length direction and the laminating direction from the width direction.

A method for manufacturing an electronic component according to a preferred embodiment of the present invention pertains to a manufacturing method of an electronic component which includes an electronic component main body including a first principal surface and a second principal surface extending along a length direction and a width direction, a first side surface and a second side surface extending along the length direction and a laminating direction, and a first end surface and a second end surface extending along the width direction and the laminating direction; a first internal electrode disposed within the electronic component main body; a second internal electrode disposed within the electronic component main body and opposed to the first internal electrode in the laminating direction with a ceramic layer interposed therebetween; a first auxiliary electrode opposed to the first internal electrode in the length direction and disposed at a distance from the first internal electrode; a second auxiliary electrode opposed to the second internal electrode in the length direction and disposed at a distance from the second internal electrode; a first external electrode disposed on the first end surface; and a second external electrode disposed on the second end surface, wherein the first external electrode includes the first conductive layer including ceramic particles, the second external electrode includes the second conductive layer including ceramic particles, and the end portion of the first internal electrode is located inside the first conductive layer.

A method for manufacturing an electronic component according to a preferred embodiment of the present invention includes a first green sheet forming step of forming a first green sheet including a first ceramic paste layer to form the ceramic layer, a first conductive paste layer to form the first conductive layer, and a second conductive paste layer to form the second conductive layer, a step of forming, on the first green sheet, a third conductive paste layer to form the first internal electrode, which is positioned above the first ceramic paste layer and above a portion of the first conductive paste layer excluding an outer end portion of the first conductive paste layer in the length direction, and a fourth conductive paste layer to form the first auxiliary electrode, which is positioned above the first ceramic paste layer and above a portion of the second conductive paste layer excluding an outer end portion of the second conductive paste layer in the length direction, a second green sheet forming step of forming a second green sheet including a fifth conductive paste layer to form the first conductive layer, which is positioned above the first conductive paste layer, a second ceramic paste layer to form the ceramic layer, which is positioned above the first ceramic paste layer, and a sixth conductive paste layer to form the second conductive layer, which is positioned above the second conductive paste layer, a step of forming, on the second green sheet, a seventh conductive paste layer to form the second internal electrode, which is positioned above the second ceramic paste layer and above a portion of the sixth conductive paste layer excluding an outer end portion of the sixth conductive paste layer in the length direction, and an eighth conductive paste layer to form the second auxiliary electrode, which is positioned above the second ceramic paste layer and above a portion of the fifth conductive paste layer excluding an outer end portion of the fifth conductive paste layer in the length direction, and a third green sheet forming step of forming a third green sheet including a ninth conductive paste layer to form the first conductive layer, which is positioned above the fifth conductive paste layer, a third ceramic paste layer to form the ceramic layer, which is positioned above the second ceramic paste layer, and a tenth conductive paste layer to form the second conductive layer, which is positioned above the sixth conductive paste layer.

In accordance with a method for manufacturing an electronic component according to a preferred embodiment of the present invention, it is possible to easily and suitably manufacture the electronic component according to the present invention.

In a method for manufacturing an electronic component according to a preferred embodiment of the present invention, an end portion of the second auxiliary electrode preferably is located inside the first conductive layer.

In a method for manufacturing an electronic component according to a preferred embodiment of the present invention, the ceramic paste layer and the conductive paste layer are preferably formed by an ink-jet method.

According to preferred embodiments of the present invention, it is possible to provide electronic components that significantly reduce or prevent cracks and have low ESR.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, examples of preferred embodiments of the present invention will be described. However, the following preferred embodiments are merely for exemplification. The present invention is not limited to the following preferred embodiments at all.

Further, in drawings referred to in the preferred embodiments, substantially identical members or functions are denoted by same symbols. Further, the drawings referred to in the preferred embodiments or the like are schematically shown. The dimensional ratios and the like of an object pictured in a drawing may be different from that of a real object. The dimensional ratios and the like of an object may differ between drawings. The dimensional ratios and the like of specific objects have to be determined in consideration of the following description.

First Preferred Embodiment

Figure 1:
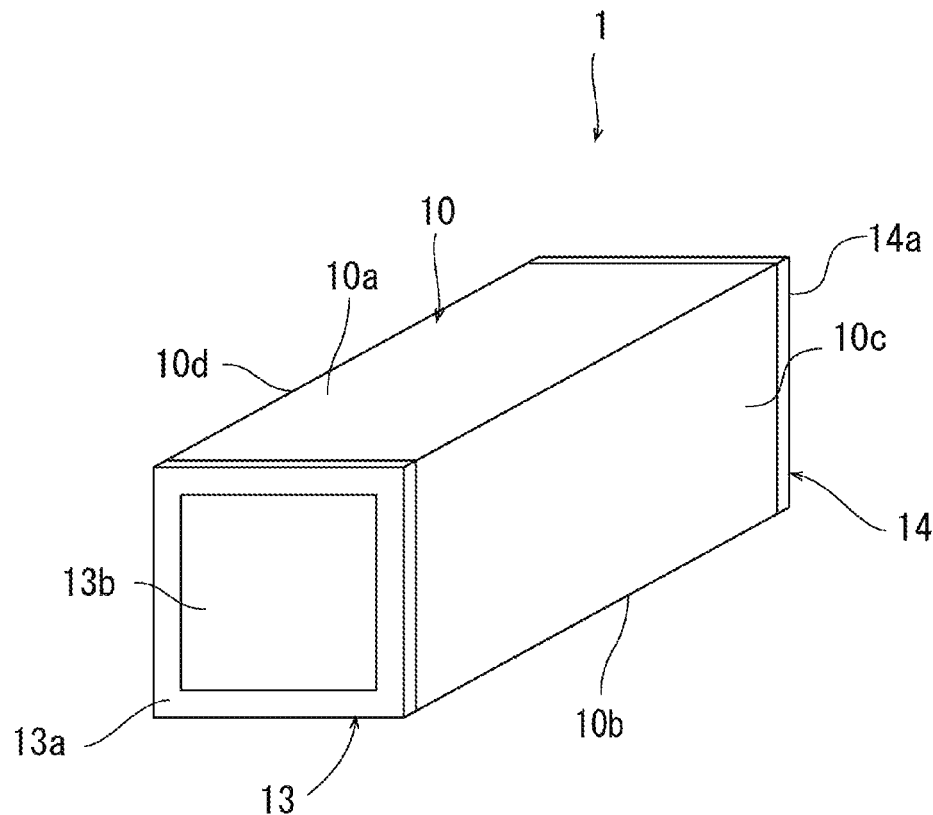
FIG. 1 is a schematic perspective view of an electronic component of a first preferred embodiment of the present invention.
Figure 2:
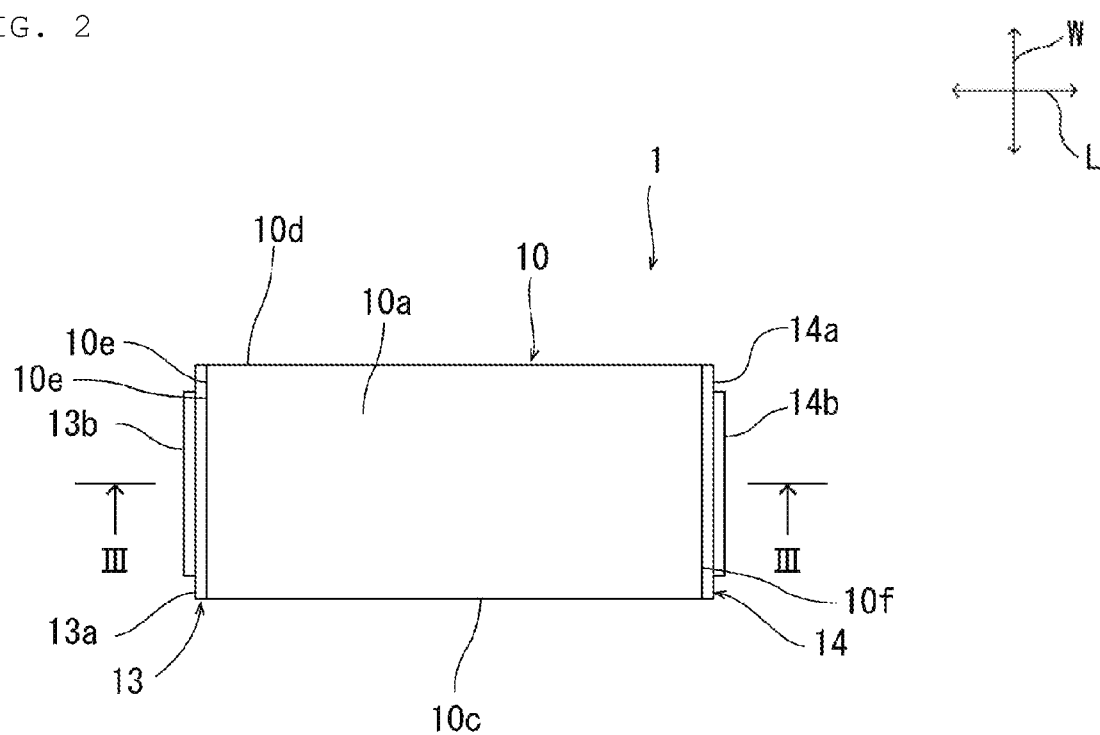
FIG. 2 is a schematic plan view of the electronic component of the first preferred embodiment of the present invention.
Figure 3:
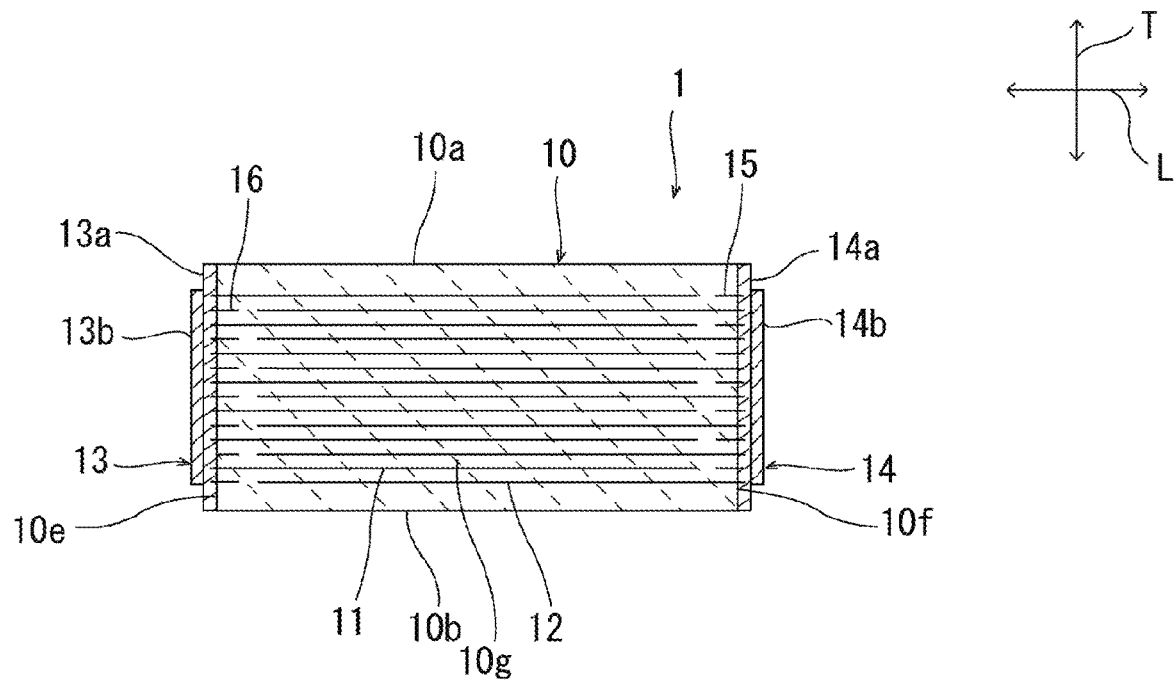
FIG. 3 is a schematic cross-sectional view taken along line III-III of FIG. 2.

FIG. 1 is a schematic perspective view of an electronic component of a first preferred embodiment of the present invention. FIG. 2 is a schematic plan view of the electronic component of the first preferred embodiment. FIG. 3 is a schematic cross-sectional view taken on line III-III of FIG. 2.

An electronic component 1 preferably includes a rectangular parallelepiped electronic component main body 10. The electronic component main body 10 includes a first principal surface 10$a$ and a second principal surface 10$b$ (refer to FIG. 3), a first side surface 10$c$ and a second side surface 10$d$ (refer to FIG. 2), and a first end surface 10$e$ and a second end surface 10$f$. The first principal surface 10$a$ and the second principal surface 10$b$ each extend along a length direction L and a width direction W. The first side surface 10$c$ and the second side surface 10$d$ each extend along a laminating direction T and the length direction L. The first end surface 10$e$ and the second end surface 10$f$ each extend along the laminating direction T and the width direction W. The length direction L, the width direction W and the laminating direction T are orthogonal to one another.

In the description of preferred embodiments of the present invention, a "rectangular parallelepiped" substance includes a rectangular or substantially rectangular parallelepiped body having corners and ridges rounded. That is, a "rectangular parallelepiped" member includes all members having the first principal surface and the second principal surface, the first side surface and the second side surface, and the first end surface and the second end surface. Further, unevenness or the like may be provided in portions of or all of the principal surfaces, the side surfaces and the end surfaces.

Dimensions of the electronic component main body 10 are not particularly limited. For example, a thickness of the electronic component main body 10 is preferably about 0.2 mm or more and about 5 mm or less, a length is preferably about 0.3 mm or more and about 40 mm or less, and a width is preferably about 0.1 mm or more and about 50 mm or less.

The electronic component 1 shown in FIG. 1 to FIG. 3 is not particularly limited as long as it is a component including an electronic component main body 10 including ceramic particles. The electronic component 1 may be, for example, a capacitor, a piezoelectric component, a thermistor, or an inductor.

The electronic component main body 10 preferably includes an insulating body such as ceramic appropriate to a function of the electronic component 1. Specifically, when the electronic component 1 is a capacitor, the electronic component main body 10 can be made of a dielectric ceramic. Specific examples of the dielectric ceramic include $BaTiO_3$, $CaTiO_3$, $SrTiO_3$, $BaCaTiO_3$, $CaZrO_3$ and the like. When the electronic component 1 is a capacitor, a sub component such as a Mn compound, a Mg compound, a Si compound, an Al compound, a V compound, a Fe compound, a Cr compound, a Co compound, a Ni compound and rare-earth compound, may be appropriately added to the electronic component main body in response to characteristics required of the electronic component 1.

When the electronic component 1 is the piezoelectric component, the electronic component main body can be made of a piezoelectric ceramic. Specific examples of the piezoelectric ceramic include PZT (lead zirconate titanate)-based ceramics.

When the electronic component 1 is, for example, a thermistor, the electronic component main body can be made of a semiconductor ceramic. Specific examples of the semiconductor ceramic include spinel-based ceramic.

When the electronic component 1 is, for example, an inductor, the electronic component main body can be made of a magnetic ceramic. Specific examples of the magnetic ceramic include ferrite ceramic.

Hereinafter, in the present preferred embodiment, an example in which the electronic component 1 is a multilayer ceramic capacitor will be described. Specifically, in the present preferred embodiment, an example in which the electronic component 1 is a multilayer ceramic capacitor including two external electrodes 13, 14 will be described. However, the present invention is not limited to this configuration. An electronic component according to a preferred embodiment of the present invention may also be a capacitor including three or more external electrodes.

As shown in FIG. 3, internal electrodes 11 and 12 are disposed within the electronic component main body 10. Specifically, a plurality of the first external electrodes 11 and a plurality of the second external electrodes 12 are disposed within the electronic component main body 10.

The first internal electrode 11 is rectangular or substantially rectangular, for example. The first internal electrode 11 is disposed in parallel or substantially in parallel with the first principal surface 10a and the second principal surface 10b. That is, the first internal electrode 11 is disposed along the length direction L and the width direction W. The first internal electrode 11 is exposed to the first end surface 10e and is not exposed to the first principal surface 10a and the second principal surface 10b, the first side surface 10c and the second side surface 10d, and the second end surface 10f.

The second internal electrode 12 is rectangular or substantially rectangular, for example. The second internal electrode 12 is disposed in parallel or substantially parallel with the first principal surface and the second principal surface 10a and 10b. That is, the second internal electrode 12 is disposed along the length direction L and the width direction W. Thus, the second internal electrode 12 and the first internal electrode 11 are parallel or substantially parallel with each other. The second internal electrode 12 is exposed to the second end surface 10f and is not exposed to the first principal surface 10a and the second principal surface 10b, the first side surface 10c and the second side surface 10d, and the first end surface 10e.

The first and the second internal electrodes 11 and 12 are alternately disposed along the laminating direction T. The first internal electrode 11 and the second internal electrode 12 adjacent to each other in the laminating direction T are opposed to each other with the ceramic layer 10g interposed therebetween. A thickness of the ceramic layer 10g can be set to, for example, about 0.2 µm or more and about 40 µm or less. A distance between the first principal surface 10a and the first and the second internal electrodes 11, 12 positioned the closest to the first principal surface 10a, and a distance between the second principal surface 10b and the first and the second internal electrodes 11, 12 positioned the closest to the second principal surface 10b are preferably, for example, about 20 µm or more and about 500 µm or less.

The first and the second internal electrodes 11 and 12 can be made of appropriate conductive materials. The first and the second internal electrodes 11 and 12 can include a metal selected from the group consisting of Ni, Cu, Ag, Pd and Au, or an alloy (e.g., Ag—Pd alloy) containing one or more metals selected from the group consisting of Ni, Cu, Ag, Pd and Au.

Further, the first and the second internal electrodes 11 and 12 may further include ceramic particles. The ceramic particles preferably include ceramic which has the same type of component as ceramic contained in the electronic component main body 10 (sometimes referred to as "common material"). The contents of the ceramic particles in the first and the second internal electrodes 11 and 12 are preferably about 3 vol % or more, and more preferably about 5 vol % or more, for example. The contents of the ceramic particles contained in the first and the second internal electrodes 11 and 12 are preferably about 20 vol % or less, and more preferably about 15 vol % or less, for example.

The thicknesses of the first and the second internal electrodes 11 and 12 are preferably about 0.2 µm or more and about 3 µm or less, for example.

As shown in FIG. 3, auxiliary electrodes 15 and 16 are disposed within the electronic component main body 10. Specifically, a plurality of the first auxiliary electrodes 15 and a plurality of the second auxiliary electrode 16 are disposed within the electronic component main body 10.

The first auxiliary electrode 15 is opposed to the first internal electrode 11 in the length direction L and disposed at a distance from the first internal electrode 11. The second auxiliary electrode 16 is opposed to the second internal electrode 12 in the length direction L and disposed at a distance from the second internal electrode 12. In other words, the first internal electrode 11 and the first auxiliary electrode 15 are disposed at a distance from each other in the length direction L on the same ceramic layer 10g. The second internal electrode 12 and the second auxiliary electrode 16 are disposed at a distance from each other in the length direction L on the same ceramic layer 10g.

The first auxiliary electrode 15 and the second internal electrode 12 are opposed to each other in the laminating direction T, but these electrodes are connected to the same second external electrode 14 and are at the same potential, and therefore these electrodes do not substantially contribute to capacitance generation. The second auxiliary electrode 16 and the first internal electrode 11 are opposed to each other in the laminating direction T, but these electrodes are connected to the same first external electrode 13 and are at the same potential, and therefore these electrodes do not substantially contribute to capacitance generation.

As shown in FIG. 2 and FIG. 3, the electronic component 1 preferably includes the first external electrode 13 and the second external electrodes 14. The first external electrode 13 is electrically connected to the first internal electrode 11 and the second auxiliary electrode 16. On the other hand, the second external electrode 14 is electrically connected to the second internal electrode 12 and the first auxiliary electrode 15.

The first external electrode 13 is provided on the first end surface 10e. In the present preferred embodiment, an example in which the first external electrode 13 is provided only on the first end surface 10e will be described. However, the present invention is not limited to this configuration. For example, the first external electrode may be located astride the first end surface and at least one of the first/second principal surfaces and the first/second side surfaces.

The first external electrode 13 preferably includes a first conductive layer 13a and a third conductive layer 13b. The first conductive layer 13a is provided on the first end surface 10e. The third conductive layer 13b is provided on the first conductive layer 13a. That is, the first and the third conductive layers 13a and 13b are laminated in this order on the first end surface 10e. The third conductive layer 13b is isolated from the electronic component main body 10 by the first conductive layer 13a.

A thickness of the first conductive layer 13a can be set to, for example, about 10 μm or more and about 200 μm or less. A thickness of the third conductive layer 13b can be set to, for example, about 0.1 μm or more and about 10 μm or less. The thickness of the first conductive layer 13a is preferably about 1.0 time or more and about 200 times or less larger than the thickness of the third conductive layer 13b, and more preferably about 10 times or more and about 200 times or less larger than the thickness of the third conductive layer 13b.

In the present preferred embodiment, the first conductive layer 13a and the third conductive layer 13b are each defined by an electrode which has been fired (fired electrode). The first conductive layer 13a and the third conductive layer 13b each include conductive particles of metal or the like. The conductive particles contained in the first conductive layer 13a and the third conductive layer 13b preferably include at least one of Cu, Ni, Ag, Pd, an Ag—Pd alloy and Au, and more preferably include Cu.

The first conductive layer 13a and the third conductive layer 13b may each include ceramic, glass or the like in addition to the conductive particles. At least the first conductive layer 13a of the first and the third conductive layers 13a and 13b preferably includes ceramic particles. In this case, the ceramic particle is preferably a common material which is the same ceramic particle as a ceramic particle contained in the electronic component main body 10. The third conductive layer 13b does not necessarily include the ceramic particles.

The content of the ceramic particle in the first conductive layer 13a is preferably about 30 vol % or more and about 70 vol % or less, and still more preferably about 40 vol % or more and about 60 vol % or less, for example.

The content of the ceramic particle in the third conductive layer 13b is preferably about 0 vol % or more and about 20 vol % or less, and more preferably about 0 vol % or more and about 10 vol % or less, for example.

The content of the ceramic particle in the first conductive layer 13a is preferably higher than the content of the ceramic particle in the third conductive layer 13b, more preferably about 1.5 times or more, and still more preferably about 2 times or more higher than the content of the ceramic particle in the third conductive layer 13b, for example.

The content of the ceramic particle can be determined by the following exemplary procedure.

First, the first side surface of the electronic component is polished along the first side surface until a width reaches half of the width of the electronic component, and polishing sagging is removed by performing ion milling to expose a cross-section.

Next, a portion having an area of $5.0 \times 10^{-4}$ mm$^2$ is selected as a measurement range in the exposed cross-section. In selection of the measurement range, a portion having less void or deformation is selected.

Next, in the measurement range, an area of ceramic particle and an area of metal in an electrode are determined. Specifically, a cross-section is observed with a scanning electron microscope, and a difference in imaging contrast in a reflected electron image discriminates between a portion of metal and a portion of ceramic particle. Then, areas of the portion of metal and the portion of ceramic particle are calculated by performing image analysis. Then, the content of the ceramic particle is determined based on the following formula. In addition, when the void is present in the measurement range, or when a material of the ceramic layer penetrates in an electrode because of, for example, deformation generated during firing, the content of the ceramic particle is calculated neglecting an area of this portion.

(Content of ceramic particle)=(Area of ceramic particle in electrode)/(Area of electrode)

The second external electrode 14 is provided on the second end surface 10f. In the present preferred embodiment, an example in which the second external electrode 14 is provided on only the second end surface 10f will be described. However, the present invention is not limited to this configuration. For example, the second external electrode may be located astride the second end surface and at least one of the first/second principal surfaces and the first/second side surfaces.

The second external electrode 14 includes a second conductive layer 14a and a fourth conductive layer 14b. The second conductive layer 14a is provided on the first end surface 10e. The fourth conductive layer 14b is provided on the second conductive layer 14a. That is, the second and the fourth conductive layers 14a and 14b are laminated in this order on the second end surface 10f. The fourth conductive layer 14b is isolated from the electronic component main body 10 by the second conductive layer 14a.

A thickness of the second conductive layer 14a can be set to, for example, about 10 μm or more and about 200 μm or less. A thickness of the fourth conductive layer 14b can be set to, for example, about 0.1 μm or more and about 10 μm or less. The thickness of the second conductive layer 14a is preferably about 1.0 time or more and about 200 times or less larger than the thickness of the fourth conductive layer 14b, and more preferably about 10 times or more and about 200 times or less larger than the thickness of the fourth conductive layer 14b, for example.

In the present preferred embodiment, the second conductive layer 14a and the fourth conductive layer 14b are each provided by an electrode which has been fired (fired electrode). The second and the fourth conductive layers 14a and 14b each include conductive particles of metal or the like. The conductive particles contained in the second and the fourth conductive layers 14a and 14b preferably include at least one of Cu, Ni, Ag, Pd, an Ag—Pd alloy and Au, and more preferably include Cu.

The second and the fourth conductive layers 14a and 14b may each further include ceramic, glass or the like in addition to the conductive particles. At least the second conductive layer 14a of the second and the fourth conductive layers 14a and 14b preferably includes ceramic particles. In this case, the ceramic particle is preferably a common material which is the same ceramic particle as a ceramic particle contained in the electronic component main body 10.

The content of the ceramic particle in the second conductive layer 14a is preferably about 30 vol % or more and about 70 vol % or less, and still more preferably about 40 vol % or more and about 60 vol % or less, for example. The content of the ceramic particle in the fourth conductive layer 14b is preferably about 0 vol % or more and about 20 vol % or less, and more preferably about 0 vol % or more and about 10 vol % or less, for example.

The content of the ceramic particle in the second conductive layer 14a is preferably higher than the content of the ceramic particle in the fourth conductive layer 14b, more preferably about 1.5 times or more, and still more preferably about 2 times or more higher than the content of the ceramic particle in the fourth conductive layer 14b, for example.

In the electronic component 1 according to the present preferred embodiment, an end portion of the first internal electrode 11 is preferably located inside the first conductive layer 13a. Specifically, the end portion of the first internal electrode 11 is located inside the first conductive layer 13a and does not penetrate through the first conductive layer 13a. As described above, the end portion of the first internal electrode 11 is located inside the first conductive layer 13a. Therefore, a length of the first conductive layer 13a which is located between a surface of the first external electrode 13 and the first internal electrode 11 and has relatively high electric resistance, is short. Thus, electric resistance between the first internal electrode 11 and the surface of the first external electrode 13 is low. Thus, electric resistance between the surface of the first external electrode 13 and a surface of the second external electrode 14 is low. Accordingly, the electronic component 1 has low ESR.

Similarly, in the electronic component 1, an end portion of the second internal electrode 12 is located inside the second conductive layer 14a. Specifically, the end portion of the second internal electrode 12 is located inside the second conductive layer 14a and does not penetrate through the second conductive layer 14a. As described above, the end portion of the second internal electrode 12 is located inside the second conductive layer 14a. Therefore, a length of the second conductive layer 14a between the surface of the second external electrode 14 and the second internal electrode 12 and has relatively high electric resistance, is short. Thus, electric resistance between the second internal electrode 12 and the surface of the second external electrode 14 is low and electric resistance between the surface of the first external electrode 13 and the surface of the second external electrode 14 is even more low. Accordingly, the electronic component 1 has lower ESR.

Further, not only the end portion of the first internal electrode 11 but also the end portion of the second auxiliary electrode 16 are preferably located inside the first conductive layer 13a. Specifically, the end portion of the second auxiliary electrode 16 is located inside the first conductive layer 13a and does not penetrate through the first conductive layer 13a. Thus, joint strength between the electronic component main body 10 and the first external electrode 13 is enhanced, and consequently connection reliability between the first internal electrode 11 and the first external electrode 13 is enhanced.

Similarly, not only the end portion of the second internal electrode 12 but also the end portion of the first auxiliary electrode 15 are located inside the second conductive layer 14a. Specifically, the end portion of the first auxiliary electrode 15 is located inside the second conductive layer 14a and does not penetrate through the second conductive layer 14a. Thus, joint strength between the electronic component main body 10 and the second external electrode 14 is enhanced, and consequently connection reliability between the second internal electrode 12 and the second external electrode 14 is enhanced.

For example, from the viewpoint of more lowering the ESR of the electronic component 1 to further enhance the connection reliability between the first internal electrode 11 and the first external electrode 13 and the connection reliability between the second internal electrode 12 and the second external electrode 14, it is also conceivable that the first internal electrode 11 and the second auxiliary electrode 16 are disposed so as to penetrate through the first conductive layer 13a, and the second internal electrode 12 and the first auxiliary electrode 15 are disposed so as to penetrate through the second conductive layer 14a. However, in doing so, the proportions of the first internal electrode 11 and the second auxiliary electrode 16 in the first conductive layer 13a are increased, and the proportions of the second internal electrode 12 and the first auxiliary electrode 15 in the second conductive layer 14a are increased. As a result of this, a difference in thermal shrinkage during firing between the first conductive layer 13a and the electronic component main body 10 is increased. Thus, cracks are easily produced during firing.

In contrast, in the electronic component 1, the first internal electrode 11 does not penetrate through the first conductive layer 13a and the first internal electrode 11 and the first internal electrode 11 and the second auxiliary electrode 16 are disposed so that their end portions position inside the first conductive layer 13a. Also, the second internal electrode 12 does not penetrate through the second conductive layer 14a and the second internal electrode 12 and the first auxiliary electrode 15 are disposed so that their end portions position inside the second conductive layer 14a. As a result of this, the proportions of the first internal electrode 11 and the second auxiliary electrode 16 in the first conductive layer 13a are reduced. The proportions of the second internal electrode 12 and the first auxiliary electrode in the second conductive layer 14a are reduced. Thus, differences in thermal shrinkage during firing between the first conductive layer 13a and the electronic component main body 10 and between the second conductive layer 14a and the electronic component main body 10 are reduced. Accordingly, in the electronic component 1, cracks are only barely produced during firing. As described above, in the electronic component 1, the end portion of the first internal electrode 11 is located inside the first conductive layer 13a and the end portion of the second internal electrode 12 is located inside the second conductive layer 14a. As a result of this, the ESR of the electronic component 1 is able to be lowered while significantly reducing or preventing cracks.

From the viewpoint of more lowering the ESR of the electronic component 1, when a length in the length direction L of a portion of the first internal electrode 11 which positions inside the first conductive layer 13a is denoted by La, and a length in the length direction L of the first conductive layer 13a is denoted by L1, La/L1 is preferably about 0.3 or more, for example. However, when La/L1 is too large, cracks tend to be produced in the electronic component main body 10 or the like during firing. Therefore, La/L1 is preferably about 0.7 or less, for example.

Similarly, when a length in the length direction L of a portion of the second internal electrode 12 which positions inside the second conductive layer 14a is denoted by Lb, and a length in the length direction L of the second conductive layer 14a is denoted by L2, Lb/L2 is preferably about 0.3 or more, for example. However, when Lb/L2 is too large, cracks tend to be produced in the electronic component main body 10 or the like during firing. Therefore, Lb/L2 is preferably about 0.7 or less, for example.

From the viewpoint of enhancing the joint strength between the electronic component main body 10 and the second external electrode 14, it is preferred to position the first auxiliary electrode 15 inside the second conductive layer 14a, and it is preferred that when a length in the length direction L of a portion of the first auxiliary electrode 15 which positions inside the second conductive layer 14a is denoted by Lc, and a length in the length direction L of the second conductive layer 14a is denoted by L2, Lc/L2 is about 0.3 or more, for example. However, when Lc/L2 is too large, cracks tend to be produced in the electronic component main body 10 or the like during firing. Therefore, Lc/L2 is preferably about 0.7 or less, for example.

Similarly, from the viewpoint of enhancing the joint strength between the electronic component main body 10 and the second external electrode 14, it is preferred to position the second auxiliary electrode 16 inside the first conductive layer 13a, and it is preferred that when a length in the length direction L of a portion of the second auxiliary electrode 16 which positions inside the first conductive layer 13a is denoted by Ld, and a length in the length direction L of the first conductive layer 13a is denoted by L1, Ld/L1 is about 0.3 or more, for example. However, when Ld/L1 is too large, cracks tend to be produced in the electronic component main body 10 or the like during firing. Therefore, Ld/L1 is preferably about 0.7 or less, for example.

In addition, in the present specification, "La/L1", "Lb/L2", "Lc/L2", and "Ld/L1" are each defined as a "penetration degree".

The penetration degree such as La/L1, Lb/L2, Lc/L2 and Ld/L1 can be measured by the following exemplary procedure.

That is, the side surface of the electronic component is polished along the side surface until a width dimension reaches half of the width of the electronic component, a polished cross-section is observed with use of an optical microscope, and thereby dimensions of La, L1, Lb, L2, Lc, L2, Ld, and L1 are measured. Thereafter, values of each of La, L1, Lb, L2, Lc, L2, Ld, and L1 are averaged, and values of La/L1, Lb/L2, Lc/L2, and Ld/L1 are able to be determined from the averaged values.

In the electronic component 1, the third conductive layer 13b having a lower ceramic particle content and lower electric resistance than those of the first conductive layer 13a is disposed on the first conductive layer 13a. Similarly, the fourth conductive layer 14b having a lower ceramic particle content and lower electric resistance than those of the second conductive layer 14a is disposed on the second conductive layer 14a. Thus, resistance between the surface of the first external electrode 13 and the surface of the second external electrode 14 is more lowered. Accordingly, ESR of the electronic component 1 is further lowered.

Furthermore, in the electronic component 1, the third conductive layer 13b which has a low ceramic particle content and is extremely different in thermal shrinkage during firing from the electronic component main body 10 is isolated from the electronic component main body 10 by the first conductive layer 13a having a higher ceramic particle content than that of the third conductive layer 13b. That is, the thermal shrinkage during firing of the first conductive layer 13a has a value between the thermal shrinkage of the electronic component main body 10 and the thermal shrinkage of the third conductive layer 13b. Therefore, production of cracks during firing is more effectively reduced or prevented.

Similarly, in the electronic component 1, the fourth conductive layer 14b which has a low ceramic particle content and is extremely different in thermal shrinkage during firing from the electronic component main body 10 is isolated from the electronic component main body 10 by the second conductive layer 14a having a higher ceramic particle content than that of the fourth conductive layer 14b. That is, the thermal shrinkage of the second conductive layer 14a has a value between the thermal shrinkage of the electronic component main body 10 and the thermal shrinkage of the fourth conductive layer 14b. Therefore, production of cracks during firing is more effectively reduced or prevented.

Further, the contents of the ceramic particle in the third conductive layer 13b and the fourth conductive layer 14b are relatively low. As a result of this, the ability of a surface of the third conductive layer 13b or the fourth conductive layer 14b to be plated is high, and the joint strength at the time when the third conductive layer 13b or the fourth conductive layer 14b to a metal terminal, is high.

Preferred Embodiment of Method of Manufacturing

Next, an example of a preferred embodiment of a method for manufacturing the electronic component 1 will be described.

The electronic component 1 can be manufactured using, for example, an ink-jet method.

Specifically, a ceramic paste to form the ceramic layer 10g including a ceramic powder, and conductive pastes to form the first and the second internal electrodes 11, 12, the first to the fourth conductive layers 13a, 13b, 14a, 14b and the first and the second auxiliary electrodes 15, 16 are prepared.

Next, using the ink-jet method, a first green sheet including a ceramic paste layer to form the electronic component main body 10 (first ceramic paste layer), a conductive paste layer to form the first conductive layer 13a (first conductive paste layer) and a conductive paste layer to form the second conductive layer 14a (second conductive paste layer), is formed (first green sheet forming step). In the first green sheet, both end portions in the length direction L are composed of the conductive paste layer, and a portion between these two conductive paste layers is composed of the ceramic paste layer. In addition, in the first green sheet forming step, a plurality of the first green sheets may be laminated by repeating paste-printing plural times.

Next, a conductive paste layer to form the first internal electrode 11 (third conductive paste layer), and a conductive paste layer to form the first auxiliary electrode 15 (fourth conductive paste layer) are printed on the first green sheet by an ink-jet method (step A). In addition, in the step A, the conductive paste layer is printed so that the end portion of the conductive paste layer to form the first internal electrode 11 is positioned above the conductive paste layer to form the first conductive layer 13a which is contained in the first green sheet, and the end portion of the conductive paste layer to form the first auxiliary electrode is positioned above the conductive paste layer to form the second conductive layer 14a which is contained in the first green sheet. In other words, the third conductive paste layer is printed so as to be positioned above the first ceramic paste layer and above a portion excluding an outer end portion in the length direction L of the first conductive paste layer. The fourth conductive paste layer is printed so as to be positioned above the first ceramic paste layer and above a portion excluding an outer end portion in the length direction L of the second conductive paste layer. By doing so, it is possible to form a first internal electrode 11 with end portion positions inside the first conductive layer 13a and a first auxiliary electrode 15 with end portion positions inside the second conductive layer 14a.

Next, on the first green sheet including the third and the fourth conductive paste layers formed thereon is formed a second green sheet including a ceramic paste layer to form the ceramic layer 10g, a conductive paste layer to form the first conductive layer 13a (fifth conductive paste layer), a conductive paste layer to form the second conductive layer 14a (sixth conductive paste layer), a conductive paste layer to form the third conductive layer 13b and a conductive paste layer to form the fourth conductive layer 14b using the ink-jet method (second green sheet forming step). In the second green sheet forming step, the fifth conductive paste layer is printed so as to be positioned above the first conductive paste layer. The second ceramic paste layer is printed so as to be positioned above the first ceramic paste layer. The sixth conductive paste layer is printed so as to be positioned above the second conductive paste layer.

Next, a conductive paste layer to form the second internal electrode 12 (seventh conductive paste layer), and a conductive paste layer to form the second auxiliary electrode 16 (eighth conductive paste layer) are printed on the second green sheet by an ink-jet method (step B). In addition, in the step B, the conductive paste layer is printed so that the end portion of the conductive paste layer to form the second internal electrode 12 is positioned above the conductive paste layer to form the sixth conductive layer which is contained in the second green sheet, and the end portion of the second auxiliary electrode 16 is positioned above the fifth conductive paste layer which is contained in the second green sheet. In other words, the seventh conductive paste layer is printed so as to be positioned above the second ceramic paste layer and above a portion excluding an outer end portion in the length direction L of the sixth conductive paste layer. The eighth conductive paste layer is printed so as to be positioned above the second ceramic paste layer and above a portion excluding an outer end portion in the length direction L of the fifth conductive paste layer. By doing so, it is possible to form a second internal electrode 12 with an end portion inside the second conductive layer 14a and a second auxiliary electrode 16 with an end portion inside the first conductive layer 13a.

The above step A, the second green sheet forming step, the above step B and the second green sheet forming step are repeated plural times in this order.

Next, using the ink-jet method, a third green sheet including a ceramic paste layer to form the electronic component main body 10 (third ceramic paste layer), a conductive paste layer to form the first conductive layer 13a (ninth conductive paste layer) and a conductive paste layer to form the second conductive layer 14a (tenth conductive paste layer), is formed (third green sheet forming step). In the third green sheet forming step, the third ceramic paste layer is printed so as to be positioned above the second ceramic paste layer. The ninth conductive paste layer is printed so as to be positioned above the fifth conductive paste layer. The tenth conductive paste layer is printed so as to be positioned above the sixth conductive paste layer. In addition, in the third green sheet forming step, a plurality of the third green sheets may be laminated by repeating paste-printing plural times.

A laminate is formed preferably by performing the above-mentioned steps. Thereafter, the formed laminate is pressed.

Then, by firing the laminate, an electronic component 1 is prepared (firing step).

A firing temperature and a firing time of the laminate can be appropriately set depending on materials to be used or the like. The firing temperature of a firing body can be set, for example, about 1100° C. or higher and about 1400° C. or lower. The firing time of the firing body can be set, for example, about 1 hour or more and about 20 hours or less. Further, in order to remove an organic component such as a binder contained in the laminate, the laminate may preferably be subjected to degreasing prior to firing.

As described in the present preferred embodiment, shaping of the electronic component 1 is preferably performed with use of an ink-jet method enables to easily shape the electronic component 1. In addition, the shaping of the electronic component 1 may be performed, for example, with use of screen printing or the like other than the ink-jet method.

Hereinafter, another example of a preferred embodiment of the present invention will be described. In the following description, members having a function substantially common to that of the first preferred embodiment is denoted by the same symbols, and descriptions of the members will be omitted.

Second Preferred Embodiment

Figure 4:
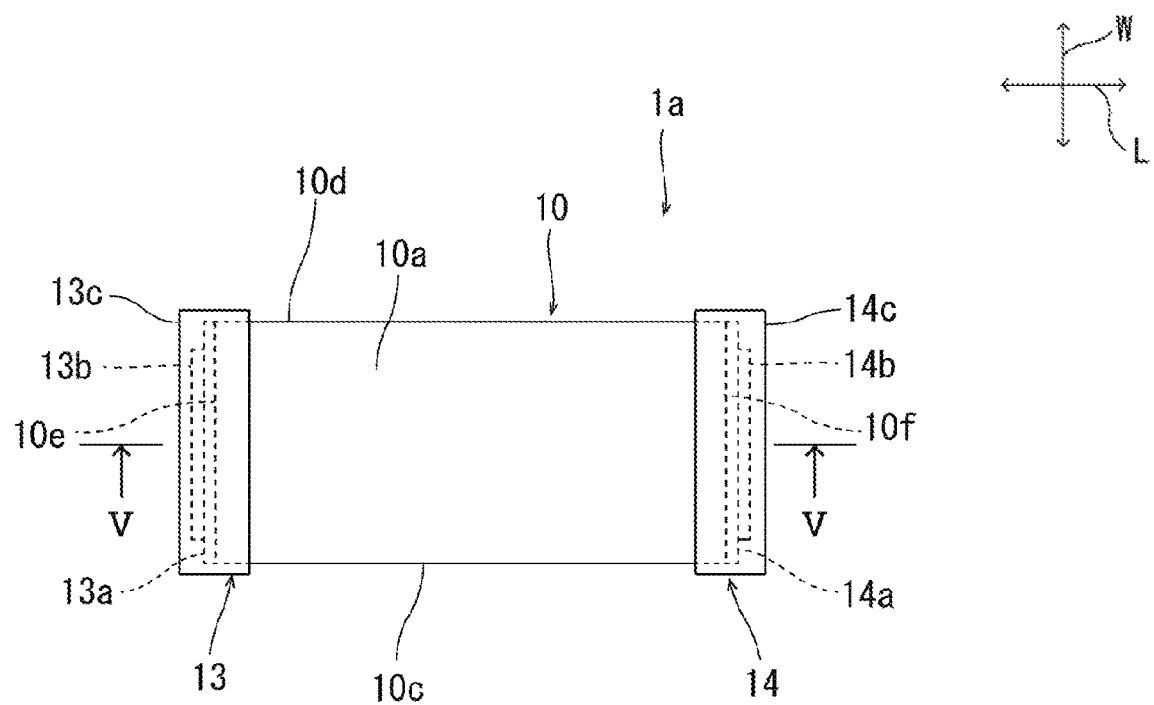
FIG. 4 is a schematic plan view of an electronic component of a second preferred embodiment of the present invention.
Figure 5:
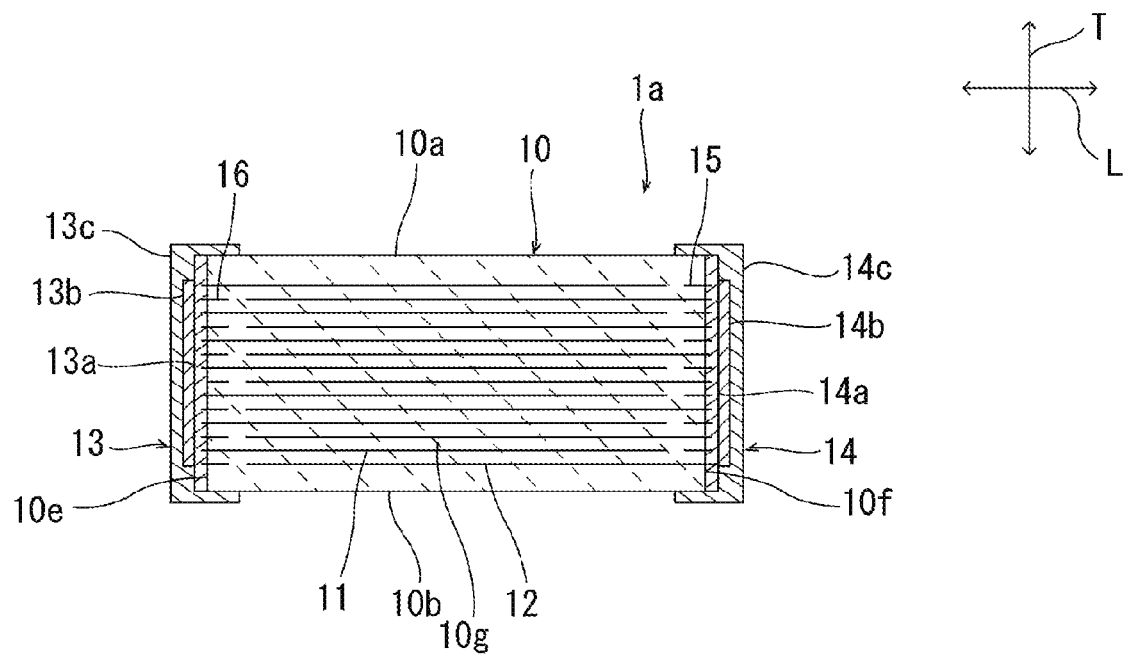
FIG. 5 is a schematic cross-sectional view taken along line V-V of FIG. 4.

FIG. 4 is a schematic plan view of the electronic component of a second preferred embodiment of the present invention. FIG. 5 is a schematic cross-sectional view taken on line V-V of FIG. 4.

The electronic component 1a shown in FIG. 4 and FIG. 5 is preferably different from the electronic component 1 according to the first preferred embodiment in that the first external electrode 13 further includes a fifth conductive layer 13c covering the conductive layers 13a and 13b, and the second external electrode 14 further includes a sixth conductive layer 14c covering the second conductive layer and the fourth conductive layer 14a and 14b. The fifth conductive layer 13c is formed to range from above the first end surfaces 10e on which the first conductive layer and the third conductive layers 13a, 13b are formed on the first principal surface 10a and the second principal surface 10b and the first side surface 10c and the second side surface 10d. The sixth conductive layer 14c is formed to range from above the second end surfaces 10f on which the second conductive layer 14a and the fourth conductive layer 14b are located to the first principal surface 10a and the second principal surface 10b and the first side surface 10c and the second side surface 10d. Disposing such fifth conductive layer 13c and sixth conductive layer 14c facilitates, for example, mounting an electronic component 1a on a mounting board. Further, it is possible to enhance the strength of mounting the electronic component 1a on a mounting board.

The fifth conductive layer 13c and the sixth conductive layer 14c may be preferably be formed by, for example, firing a conductive paste printed by the ink-jet method, screen printing or the like, or may be formed by bringing the conductive paste into contact with the end portion of the laminate to form a conductive paste layer and firing the conductive paste layer.

A plating layer may be formed on the surfaces of the fifth and the sixth conductive layers 13c and 14c.

Third Preferred Embodiment

Figure 6:
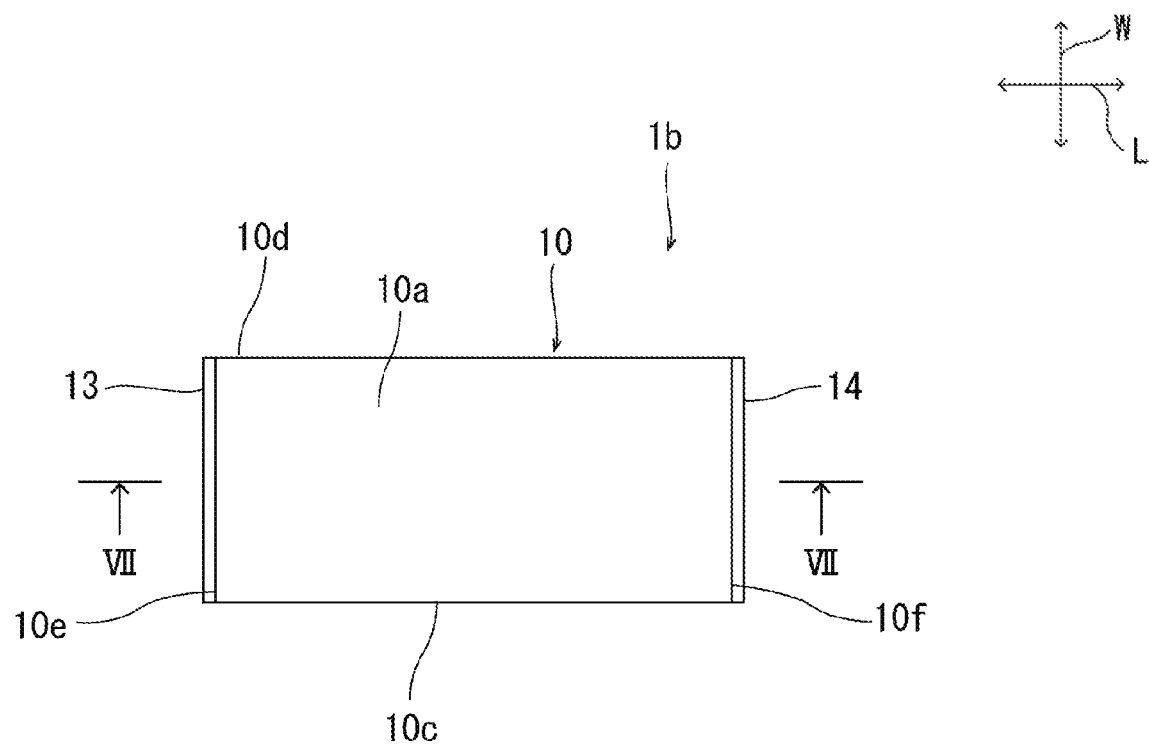
FIG. 6 is a schematic plan view of an electronic component of a third preferred embodiment of the present invention.
Figure 7:
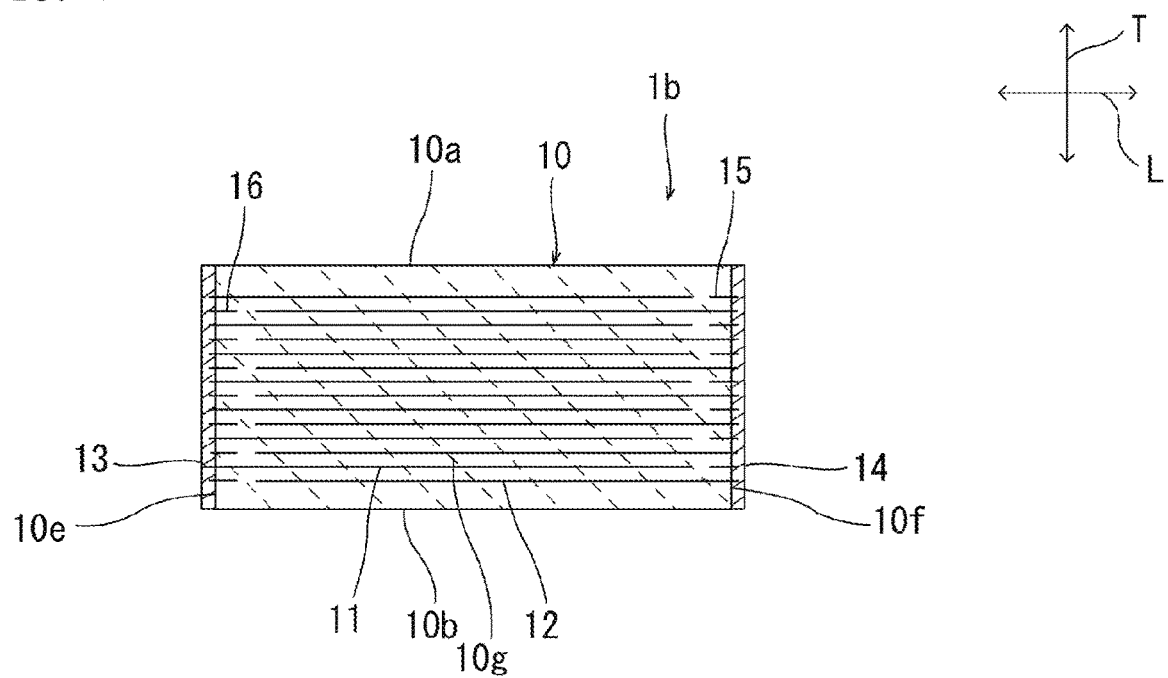
FIG. 7 is a schematic cross-sectional view taken along line VII-VII of FIG. 6.

FIG. 6 is a schematic plan view of the electronic component of a third preferred embodiment of the present invention. FIG. 7 is a schematic cross-sectional view taken on line VII-VII of FIG. 6.

The electronic component 1b according to the third preferred embodiment is different from the electronic component 1 according to the first preferred embodiment in that the first external electrode 13 is defined by only the conductive layer inside which the end portion of the first internal electrode 11 positions, and the second external electrode 14 is defined by only the conductive layer inside which the end portion of the second internal electrode 12 positions. In preferred embodiments of the present invention, the first external electrode only has to have at least the conductive layer inside which the end portion of the first internal electrode or the end portion of the second auxiliary electrode positions, and the second external electrode only has to have at least the conductive layer inside which the end portion of the second internal electrode or the end portion of the first auxiliary electrode positions.

In addition, a plating layer may be provided on the surfaces of at least one of the first external electrode 13 and the second external electrode 14.

Fourth Preferred Embodiment

Figure 8:
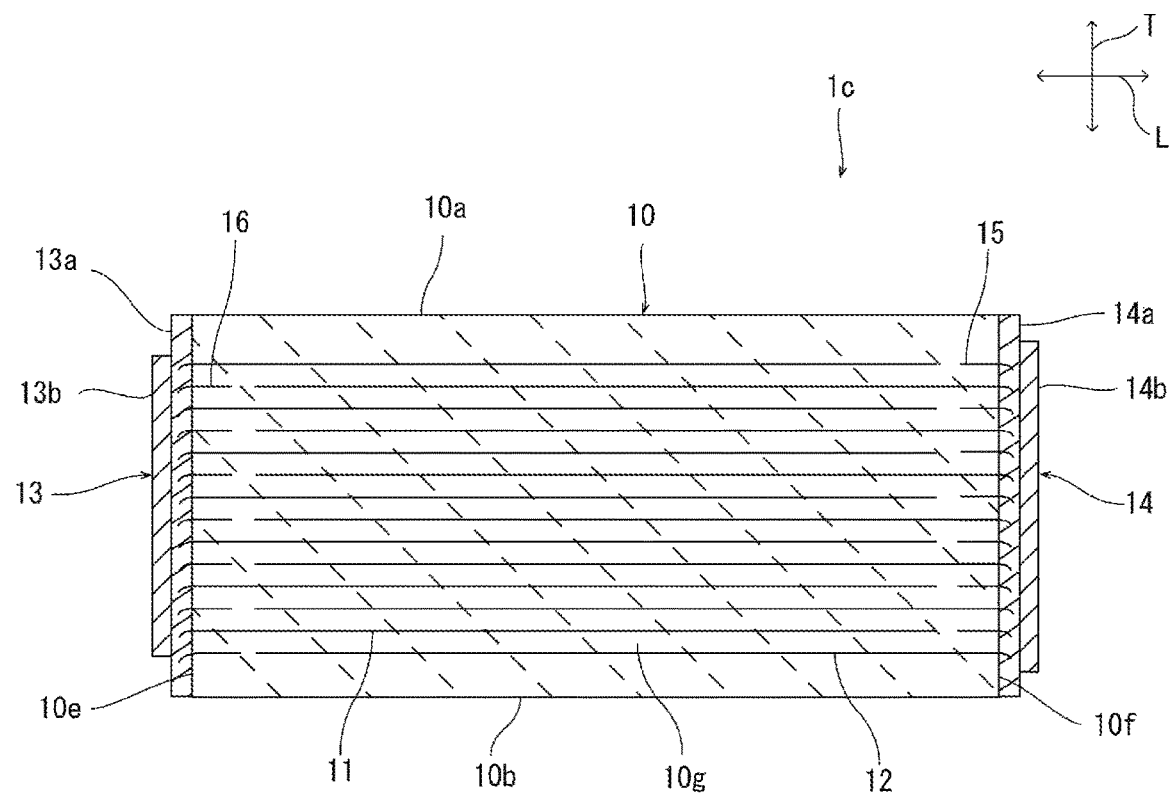
FIG. 8 is a schematic cross-sectional view of an electronic component of a fourth preferred embodiment of the present invention.

FIG. 8 is a schematic plan view of the electronic component of a fourth preferred embodiment of the present invention.

The electronic component 1c shown in FIG. 8 is different from the electronic component 1 according to the first preferred embodiment in that each of end portions of the first internal electrode 11 and the second auxiliary electrode 16 which position inside the first conductive layer 13a, and end portions of the second internal electrode 12 and the first auxiliary electrode 15 which position inside the second conductive layer 14a, has a curved shape in viewing from the width direction W.

In the present preferred embodiment, since the end portions of the first internal electrode 11 and the second auxiliary electrode 16 which position inside the first conductive layer 13a, have a curved shape, a contact area between the first conductive layer 13a and the first internal electrode 11/the second auxiliary electrode 16 is large. Further, an anchor effect is generated by curved portions of the end portions of the first internal electrode 11 and the second auxiliary electrode 16. Accordingly, the connection reliability between the first internal electrode 11/the second auxiliary electrode 16 and the first external electrode 13 is further high.

Similarly, in the present preferred embodiment, since the end portions of the second internal electrode 12 and the first auxiliary electrode 15 which position inside the second conductive layer 14a, have a curved shape, a contact area between the second conductive layer 14a and the second internal electrode 12/the first auxiliary electrode 15 is large. Further, an anchor effect is generated by curved portions of the end portions of the second internal electrode 12 and the first auxiliary electrode 15. Accordingly, the connection reliability between the second internal electrode 12/the first auxiliary electrode 15 and the second external electrode 14 is further high.

In addition, a plating layer may be provided on the surfaces of at least one of the first external electrode 13 and the second external electrode 14.

The present invention will be described in more detail below based on specific examples of preferred embodiments, but the present invention is not limited to the following Examples, and variations and modifications may be appropriately made without departing from the gist of the present invention.

Example 1

An example of a multilayer ceramic capacitor having the substantially same constitution as in the electronic component 1 according to the first preferred embodiment was prepared under the following conditions using the ink-jet method. In addition, in Example 1, the first auxiliary electrode 15 and the second auxiliary electrode 16 are positioned inside the first conductive layer and inside the second conductive layer, respectively, as with the first internal electrode 11 and the second internal electrode 12.

Size of multilayer ceramic capacitor (design value): 8 mm×6 mm×4 mm

Thickness of ceramic layer: average 10 μm

Thickness of internal electrode: average 2.0 μm

Number of laminated internal electrodes: 305

Distance between internal electrode positioned the closest to principal surface and principal surface: 300 μm Ceramic layer: potassium zirconate Internal electrode and external electrode: Ni containing common material (potassium zirconate) as ceramic particle La/L1: 0.5

Lb/L2: 0.5

Lc/L2: 0.5

Ld/L1: 0.5

Length in length direction L of multilayer ceramic capacitor of first and second conductive layers 13a and 14a: 70 μm Length in length direction L of multilayer ceramic capacitor of third and fourth conductive layers 13b and 14b: 70 μm Content of common material in first and second conductive layers 13a, 14a: 40 vol %

Content of common material in third and fourth conductive layers 13b, 14b: 0 vol % (conductive layers 13b, 14b do not contain a common material)

Firing of laminate: At first, low-temperature degreasing was performed at 280° C. for five hours in a nitrogen atmosphere, and then high-temperature degreasing was performed at 800° C. for five hours. Thereafter, firing was performed at 1330° C. for five hours in a reducing atmosphere.

Example 2

An example of a multilayer ceramic capacitor was prepared in the same manner as in Example 1 except for changing the contents of the common materials in the first and the second conductive layers 13a and 14a to 55 vol %.

Example 3

An example of a multilayer ceramic capacitor was prepared in the same manner as in Example 1 except for changing the contents of the common materials in the first and the second conductive layers 13a and 14a to 70 vol %.

Example 4

An example of a multilayer ceramic capacitor was prepared in the same manner as in Example 1 except for changing the contents of the common materials in the first and the second conductive layers 13a and 14a to 40 vol % and changing the contents of the common materials in the third and the fourth conductive layers 13b and 14b to 10 vol %.

Example 5

An example of a multilayer ceramic capacitor was prepared in the same manner as in Example 4 except for changing the contents of the common materials in the first and the second conductive layers 13a and 14a to 55 vol %.

Example 6

An example of a multilayer ceramic capacitor was prepared in the same manner as in Example 4 except for changing the contents of the common materials in the first and the second conductive layers 13a and 14a to 70 vol %.

Example 7

An example of a multilayer ceramic capacitor was prepared in the same manner as in Example 1 except for changing the contents of the common materials in the first and the second conductive layers 13a and 14a to 40 vol % and changing the contents of the common materials in the third and the fourth conductive layers 13b and 14b to 20 vol %.

Example 8

An example of a multilayer ceramic capacitor was prepared in the same manner as in Example 7 except for changing the contents of the common materials in the first and the second conductive layers 13a and 14a to 55 vol %.

Example 9

An example of a multilayer ceramic capacitor was prepared in the same manner as in Example 7 except for changing the contents of the common materials in the first and the second conductive layers 13a and 14a to 70 vol %.

Example 10

An example of a multilayer ceramic capacitor was prepared in the same manner as in Example 5 except for changing the penetration degrees of the first and the second internal electrodes 11 and 12 and the first and the second auxiliary electrodes 15 and 16 to a value shown in Table 1.

Example 11

An example of a multilayer ceramic capacitor was prepared in the same manner as in Example 5 except for changing the penetration degrees of the first and the second internal electrodes 11 and 12 and the first and the second auxiliary electrodes 15 and 16 to a value shown in Table 1.

Example 12

An example of a multilayer ceramic capacitor was prepared in the same manner as in Example 5 except for changing the penetration degrees of the first and the second internal electrodes 11 and 12 and the first and the second auxiliary electrodes 15 and 16 to a value shown in Table 1.

Example 13

An example of a multilayer ceramic capacitor was prepared in the same manner as in Example 5 except for changing the penetration degrees of the first and the second internal electrodes 11 and 12 and the first and the second auxiliary electrodes 15 and 16 to a value shown in Table 1.

Example 14

An example of a multilayer ceramic capacitor was prepared in the same manner as in Example 5 except for changing the penetration degrees of the first and the second internal electrodes 11 and 12 and the first and the second auxiliary electrodes 15 and 16 to a value shown in Table 1.

Example 15

An example of a multilayer ceramic capacitor was prepared in the same manner as in Example 5 except for changing the penetration degrees of the first and the second internal electrodes 11 and 12 and the first and the second auxiliary electrodes 15 and 16 to a value shown in Table 1.

Example 16

An example of a multilayer ceramic capacitor was prepared in the same manner as in Example 5 except for changing the penetration degrees of the first and the second internal electrodes 11 and 12 and the first and the second auxiliary electrodes 15 and 16 to a value shown in Table 1.

Comparative Example 1

Figure 9:
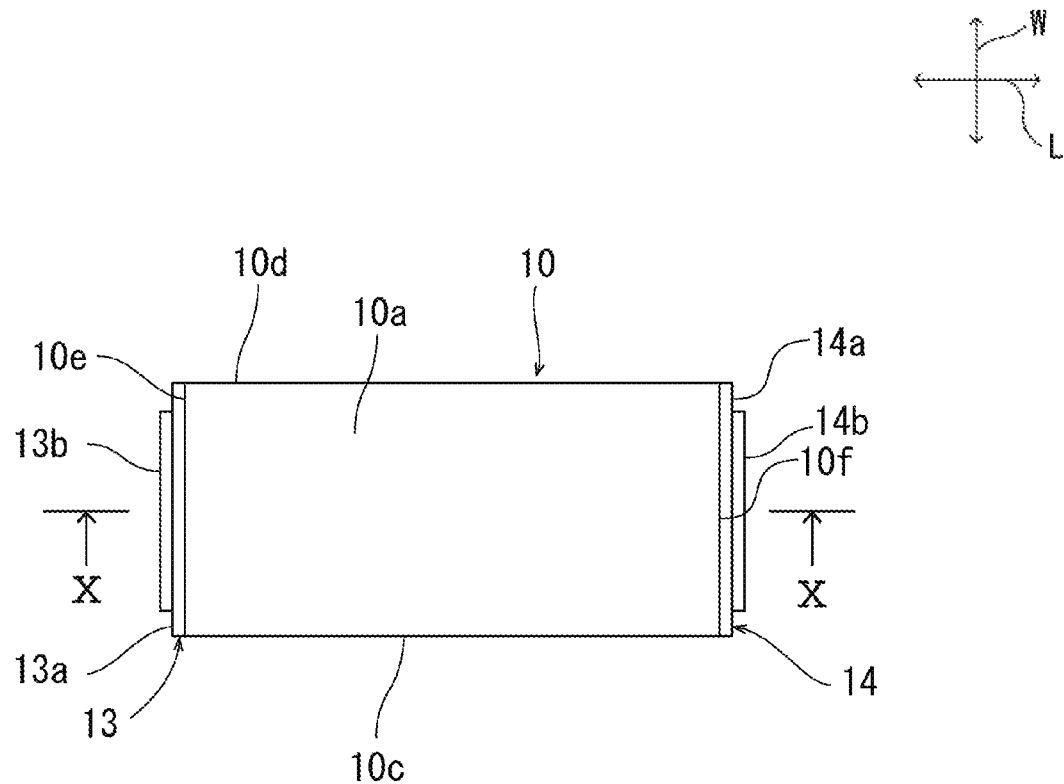
FIG. 9 is a schematic plan view of an electronic component prepared in Comparative Example 1.
Figure 10:
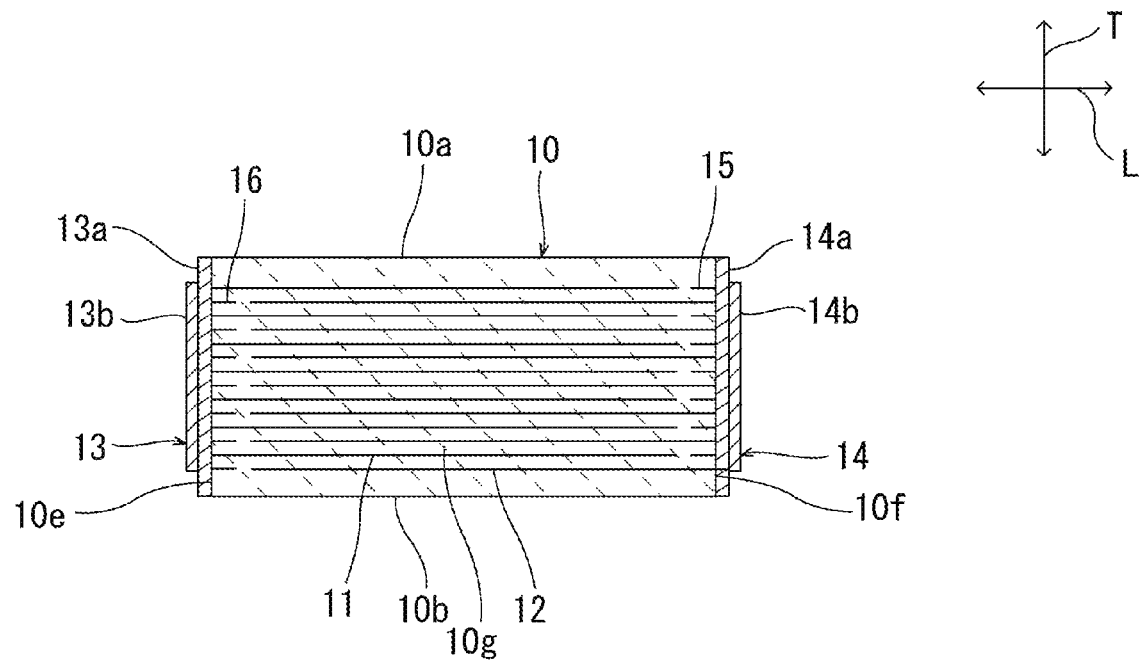
FIG. 10 is a schematic cross-sectional view taken along line X-X of FIG. 9.

A multilayer ceramic capacitor was prepared in the same manner as in Example 5 except for not disposing the first and the second internal electrodes 11, 12 and the first and the second auxiliary electrodes 15, 16 inside the first or second conductive layer 13a or 14a, as shown in FIG. 9 and FIG. 10.

Comparative Example 2

Figure 11:
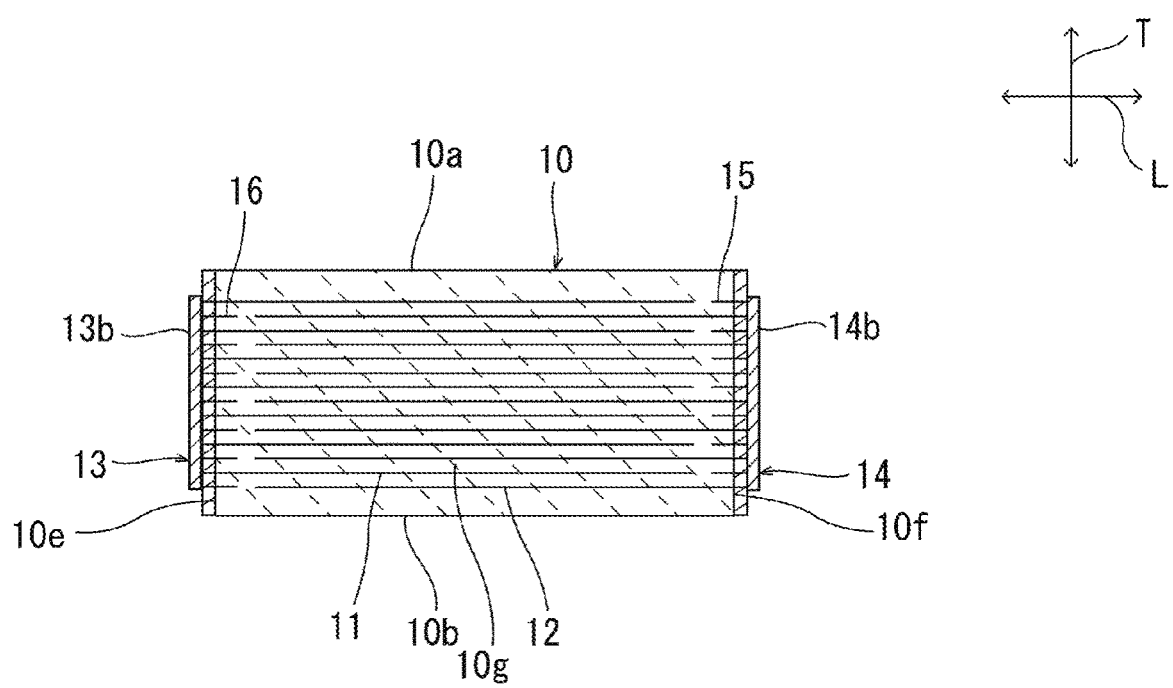
FIG. 11 is a schematic cross-sectional view of an electronic component prepared in Comparative Example 2.

A multilayer ceramic capacitor was prepared in the same manner as in Example 5 except that the first and the second internal electrodes 11, 12 and the first and the second auxiliary electrodes 15, 16 each have a structure of penetrating through the first or second conductive layer 13a or 14a, as shown in FIG. 11.

Measuring Method of Thickness of Internal Electrode

The side surface of the multilayer ceramic capacitor is polished along the side surface until a width dimension reaches half of the width of the multilayer ceramic capacitor. Thereafter, a cross-section exposed by polishing is observed with a scanning electron microscope. Next, in the cross-section of the laminate are drawn at equal intervals a total five straight lines of a center line which passes through the center in the length direction L along the laminating direction T and two straight lines on each side of the center line, a thickness of an internal electrode positioned at an upper portion in the laminating direction of each straight line, a thickness of an internal electrode positioned at a middle portion, and a thickness of an internal electrode positioned at a lower portion are measured. An average value of measured fifteen thicknesses was defined as a thickness of the internal electrode (average thickness of internal electrode).

Measuring Method of Thickness of Ceramic Layer

The thickness of the ceramic layer was measured by the same method as the measuring method of the thickness of the internal electrode.

Measuring Method of Length in Length Direction L of Multilayer Ceramic Capacitor of First and Second Conductive Layers 13a and 14a The side surface of the multilayer ceramic capacitor is polished along the side surface until a width dimension reaches half of the width of the multilayer ceramic capacitor. Thereafter, a cross-section exposed is observed with a scanning electron microscope. In the cross-section, lengths in the length direction L of the multilayer ceramic capacitor of the first and the second conductive layers 13a and 14a were measured. The first and the second conductive layers 13a and 14a were positioned at a middle in the laminating direction of the end surface.

Measuring Method of Length in Length Direction L of Multilayer Ceramic Capacitor of Third and Fourth Conductive Layers 13b and 14b The side surface of the multilayer ceramic capacitor is polished along the side surface until a width dimension reaches half of the width of the multilayer ceramic capacitor. Thereafter, a cross-section exposed is observed with a scanning electron microscope. In the cross-section, lengths in the length direction L of the multilayer ceramic capacitor of the first, the third and the fourth conductive layers 13b and 14b were measured. The third and the fourth conductive layers 13b and 14b were positioned at a middle in the laminating direction of the end surface.

Measurement of Content of Common Material

The content of the common material was determined by the method described in the first preferred embodiment. Observation with a scanning electron microscope was performed at a magnification of 1000 times.

Measurement of ESR

ESR of samples prepared in Examples and Comparative Examples was measured at 1 MHz using a precision LCR meter "E4980A" and a test-fixture "16044A" manufactured by Agilent Technologies Japan, Ltd. This ESR measurement was performed on five samples for each of Examples and Comparative Examples, and an average value of five samples was defined as ESR. The results are shown in Table 1.

Evaluation of Presence or Absence of Cracks

In 10 samples prepared for each of the Examples and the Comparative Examples, the first side surface of the sample was polished along the first side surface until a width reached half of the width of the sample, and polishing sagging was removed by performing ion milling to expose a cross-section. The cross-section was observed, and presence or absence of cracks. The results are shown in Table 1.

TABLE 1

| | Content of Common Material (vol %) | | Penetration Degree (%) | ESR Value (mΩ) | Number of Produced Cracks/ Number of Samples |
|---|---|---|---|---|---|
| | Conductive Layers 13a, 14a | Conductive Layers 13b, 14b | | | |
| Example 1 | 40 | 0 | 50 | 5 | 0/10 |
| Example 2 | 55 | 0 | 50 | 6 | 0/10 |
| Example 3 | 70 | 0 | 50 | 6 | 0/10 |
| Example 4 | 40 | 10 | 50 | 5 | 0/10 |
| Example 5 | 55 | 10 | 50 | 6 | 0/10 |
| Example 6 | 70 | 10 | 50 | 6 | 0/10 |
| Example 7 | 40 | 20 | 50 | 5 | 0/10 |
| Example 8 | 55 | 20 | 50 | 6 | 0/10 |
| Example 9 | 70 | 20 | 50 | 8 | 0/10 |
| Example 10 | 55 | 10 | 20 | 9 | 0/10 |
| Example 11 | 55 | 10 | 30 | 6 | 0/10 |
| Example 12 | 55 | 10 | 40 | 6 | 0/10 |
| Example 13 | 55 | 10 | 60 | 6 | 0/10 |
| Example 14 | 55 | 10 | 70 | 6 | 0/10 |
| Example 15 | 55 | 10 | 80 | 6 | 1/10 |
| Example 16 | 55 | 10 | 90 | 6 | 2/10 |
| Comparative Example 1 | 55 | 10 | 0 | 12 | 0/10 |
| Comparative Example 2 | 55 | 10 | 100 | 4 | 9/10 |

As shown in Table 1, it is confirmed that the production of cracks is significantly reduced or prevented and the ESR is lowered by positioning the end portion of the internal electrode and the end portion of the auxiliary electrode inside the conductive layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
an electronic component main body including ceramic particles and including a first principal surface and a second principal surface extending along a length direction and a width direction, a first side surface and a second side surface extending along the length direction and a laminating direction, and a first end surface and a second end surface extending along the width direction and the laminating direction;
a first internal electrode disposed within the electronic component main body;
a second internal electrode disposed within the electronic component main body and opposed to the first internal electrode in the laminating direction with a ceramic layer interposed therebetween;
a first auxiliary electrode opposed to the first internal electrode in the length direction and disposed at a distance from the first internal electrode;
a second auxiliary electrode opposed to the second internal electrode in the length direction and disposed at a distance from the second internal electrode;
a first external electrode disposed on the first end surface; and
a second external electrode disposed on the second end surface;
the first external electrode including a first conductive layer including ceramic particles;
the second external electrode including a second conductive layer including ceramic particles;
an end portion of the first internal electrode is located inside the first conductive layer;
the first conductive layer is disposed on only the first end surface; and
the second conductive layer is disposed on only the second end surface.

2. The electronic component according to claim 1, wherein an end portion of the second auxiliary electrode is located inside the first conductive layer.

3. The electronic component according to claim 2, wherein a portion of the first auxiliary electrode which is located inside the second conductive layer has a curved shape.

4. The electronic component according to claim 1, wherein an end portion of the second internal electrode is located inside the second conductive layer.

5. The electronic component according to claim 4, wherein a portion of the second internal electrode which is located inside the second conductive layer has a curved shape when viewing a cross-section along the length direction and the laminating direction from the width direction.

6. The electronic component according to claim 1, wherein an end portion of the first auxiliary electrode is located inside the second conductive layer.

7. The electronic component according to claim 6, wherein a portion of the second auxiliary electrode which is located inside the first conductive layer has a curved shape.

8. The electronic component according to claim 1, wherein
the first external electrode includes a third conductive layer disposed on the first conductive layer; and
a content of the ceramic particles in the first conductive layer is higher than a content of the ceramic particles in the third conductive layer.

9. The electronic component according to claim 8, wherein
the second external electrode includes a fourth conductive layer disposed on the second conductive layer; and
a content of the ceramic particles in the second conductive layer is higher than a content of the ceramic particles in the fourth conductive layer.

10. The electronic component according to claim 9, wherein the fourth conductive layer is spaced away from the electronic component main body by the second conductive layer.

11. The electronic component according to claim 9, wherein
the second external electrode further includes a sixth conductive layer disposed on the second conductive layer and the fourth conductive layer; and
the sixth conductive layer extends from above the second end surface on which the second conductive layer and the fourth conductive layer are located to the first principal surface and the second principal surface and the first side surface and the second side surface.

12. The electronic component according to claim 8, wherein the third conductive layer is spaced away from the electronic component main body by the first conductive layer.

13. The electronic component according to claim 8, wherein
the first external electrode further includes a fifth conductive layer disposed on the first conductive layer and the third conductive layer; and
the fifth conductive layer extends from above the first end surface on which the first conductive layer and the third conductive layer are located to the first principal surface and the second principal surface and the first side surface and the second side surface.

14. The electronic component according to claim 1, wherein a portion of the first internal electrode which is located inside the first conductive layer has a curved shape when viewing a cross-section along the length direction and the laminating direction from the width direction.

15. The electronic component according to claim 1, wherein
the first external electrode includes only the first conductive layer including the ceramic particles;
the second external electrode includes only the second conductive layer including ceramic particles; and
plating layers are provided over the first external electrode and the second external electrode.

* * * * *